United States Patent
Abe et al.

(10) Patent No.: US 10,224,464 B2
(45) Date of Patent: Mar. 5, 2019

(54) LIGHT EMITTING DEVICE PACKAGE HAVING LEAD ELECTRODE WITH VARYING THICKNESS

(71) Applicant: Nichia Corporation, Anan-shi, Tokushima (JP)

(72) Inventors: Koji Abe, Tokushima (JP); Yuki Shiota, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 92 days.

(21) Appl. No.: 14/978,670

(22) Filed: Dec. 22, 2015

(65) Prior Publication Data
US 2016/0190399 A1 Jun. 30, 2016

(30) Foreign Application Priority Data
Dec. 25, 2014 (JP) ................................. 2014-263695

(51) Int. Cl.
*H01L 21/56* (2006.01)
*H01L 23/31* (2006.01)
(Continued)

(52) U.S. Cl.
CPC .......... *H01L 33/486* (2013.01); *H01L 21/565* (2013.01); *H01L 23/3121* (2013.01); *H01L 23/3142* (2013.01); *H01L 33/005* (2013.01); *H01L 33/502* (2013.01); *H01L 33/56* (2013.01); *H01L 33/62* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01);
(Continued)

(58) Field of Classification Search
CPC ............ H01L 33/62; H01L 2933/0016; H01L 2933/0033; H01L 2933/005; H01L 2933/0066; H01L 33/52–33/56; H01L 21/565; H01L 23/4121; H01L 23/4142
See application file for complete search history.

(56) References Cited

U.S. PATENT DOCUMENTS

2004/0159850 A1 8/2004 Takenaka
2005/0280017 A1 12/2005 Oshio et al.
(Continued)

FOREIGN PATENT DOCUMENTS

JP 2004-274027 A 9/2004
JP 2005-353914 A 12/2005
(Continued)

*Primary Examiner* — Kevin Parendo
(74) *Attorney, Agent, or Firm* — Foley & Lardner LLP

(57) ABSTRACT

A package for mounting a light emitting element includes: a first lead electrode having, in a plan view, a first region, a second region surrounding a periphery of the first region having a width of 110 μm or more and a thickness greater than that of the first region, and a third region partially surrounding a periphery of the second region and having a thickness smaller than that of the second region; a second lead electrode spaced apart from the first lead electrode; and a resin molded body fixing a portion of each of the first and second lead electrodes. A portion of each of the first and second lead electrodes and a portion of the resin molded body exposed therebetween form a bottom surface of a recess.

21 Claims, 11 Drawing Sheets

(51) Int. Cl.
  *H01L 33/00*    (2010.01)
  *H01L 33/48*    (2010.01)
  *H01L 33/56*    (2010.01)
  *H01L 33/62*    (2010.01)
  *H01L 33/50*    (2010.01)

(52) U.S. Cl.
  CPC .......................... *H01L 2933/005* (2013.01); *H01L 2933/0016* (2013.01); *H01L 2933/0033* (2013.01); *H01L 2933/0066* (2013.01)

(56) References Cited

U.S. PATENT DOCUMENTS

2013/0049058 A1* 2/2013 Kobayakawa ........ H01L 33/486
  257/98
2013/0062649 A1   3/2013 Hata et al.
2013/0299854 A1  11/2013 Lee et al.

FOREIGN PATENT DOCUMENTS

| JP | 2008-131012 A | 6/2008 |
| JP | 2008-177496 A | 7/2008 |
| JP | 2012-146816 A | 8/2012 |
| JP | 2013-062393   | 4/2013 |
| JP | 2013-239708   | 11/2013 |
| JP | 2014-029995 A | 2/2014 |
| JP | 2014-140073 A | 7/2014 |
| JP | 2015-041683 A | 3/2015 |

\* cited by examiner

LIGHT EMITTING DEVICE PACKAGE HAVING LEAD ELECTRODE WITH VARYING THICKNESS

CROSS-REFERENCE TO RELATED APPLICATION

This application claims priority to Japanese Patent Application No. 2014-263695 filed on Dec. 25, 2014. The entire disclosure of Japanese Patent Application No. 2014-263695 is hereby incorporated herein by reference.

BACKGROUND

1. Technical Field

The present disclosure relates to a package, a light emitting device, and methods of manufacturing the package and the light emitting device.

2. Description of the Related Art

Various types of light emitting devices using a light emitting element and methods of manufacturing the same have been developed. For example, JP 2014-29995 A discloses a light emitting device having a linear protrusion at a lead frame, and a method of manufacturing the light emitting device. Also for example, JP 2004-274027 A and JP 2005-353914 A each disclose a light emitting device in which a portion of a lead frame forming a bottom surface of a recess is recessed to place a light emitting element therein, and a method of manufacturing the light emitting device.

Meanwhile, a method of manufacturing a light emitting diode (hereinafter referred to as an "LED") includes molding a package, and an LED is manufactured through the molding step. In manufacturing an LED, transfer molding has been typically employed, in which a lead frame is set in a mold and liquid resin is injected. However, with such a method of manufacturing an LED, the resin flows into a gap between the lead frame and the mold, which may result in the generation of resin burrs. Such resin burrs may cause a bonding failure of LED elements and/or wires, so the burrs must be removed. Accordingly, in conventional manufacturing of an LED, the molding is always followed by removing burrs.

In such a method of manufacturing an LED, examples of ways to prevent generation of resin burrs include optimizing conditions in the molding, increasing the pressing force of the mold, reducing the number of LEDs molded with a single lead frame, increasing the viscosity of resin to reduce flowability or the like.

Further, JP2014-29995 A discloses that, in a lead frame provided with a plating layer on its surface, burrs can be reduced by allowing the plating layer to rise and protrude at the border of a portion where a metal portion is desired to be exposed (a LED mounting portion, a wire bonding portion).

The mold disclosed in JP 2014-29995 A is provided with a projection having a shape corresponding to a recess of a package. Accordingly, the mold has the following structure. When the lead frame is clamped, the projection of the mold abuts and is pressed against a linear protrusion formed by plating raised at the boundary of the LED mounting portion or the like. Thus, entry of resin which will become burrs is prevented.

However, in the method of manufacturing disclosed in JP 2014-29995 A, the width of the linear protrusion is small, so that formation of the protrusion on the lead frame is difficult.

In the light emitting device and the method of manufacturing the same disclosed in JP 2004-274027 A and JP 2005-353914 A, in order to facilitate control of the directivity of light and to improve the light-extracting efficiency, a portion of the lead frame forming the bottom surface of the recess is further recessed. Thus, neither of these disclosures discloses preventing the generation of burrs. Accordingly, the methods disclosed in JP 2004-274027 A and JP 2005-353914 A are insufficient to prevent generation of burrs.

SUMMARY

The embodiments of the present disclosure provide a package and a light emitting device in which generation of burrs is suppressed, and methods of easily manufacturing the package and the light emitting device while suppressing generation of burrs.

A package for mounting a light emitting element according to certain embodiments of the present disclosure include a recess; a first lead electrode having, in a plan view, a first region, a second region surrounding a periphery of the first region and having a width of 110 μm or more and a thickness greater than that of the first region, and a third region surrounding at least a portion of a periphery of the second region and having a thickness smaller than that of the second region, the first lead electrode forming a portion of a bottom surface of the recess; a second lead electrode arranged spaced apart from the first lead electrode and forming a portion of the bottom surface of the recess; and a resin molded body that fixes a portion of the first lead electrode and part of the second lead electrode, and forms at least a portion of a lateral surface of the recess.

Further, a light emitting device according to certain embodiments of the present disclosure includes the package and a light emitting element mounted on the first region.

Still further, a method of manufacturing a package for mounting a light emitting element according to certain embodiments of the present disclosure includes providing a first lead electrode and a second lead electrode, the first lead electrode having, in a plan view, a first region, a second region surrounding a periphery of the first region and having a width of 110 μm or more and a thickness greater than that of the first region, and a third region surrounding at least a portion of a periphery of the second region and having a thickness smaller than that of the second region, the first lead electrode and the second lead electrode respectively forming a portion of a bottom surface of a recess; forming a package including the first lead electrode, the second lead electrode, and a resin molded body, the package having a recess, the step of forming the package including using a mold having an upper mold part having a projection with a shape corresponding to the recess and a lower mold part on which the first lead electrode and the second lead electrode are to be placed; placing the first lead electrode and the second lead electrode in predetermined positions on the lower mold part so that the first lead electrode and the second lead electrode are set between the upper mold part and the lower mold part and that the second region abuts the upper mold part; pressing the upper mold part against the first lead electrode and the second lead electrode; injecting a resin into the mold that is in contact with the first lead electrode and the second lead electrode; curing the injected resin to harden the resin molded body; and removing the upper mold part from the lower mold part.

Still further, a method of manufacturing a package for mounting a light emitting element according to certain embodiments of the present disclosure includes providing a first lead electrode and a second lead electrode, the first lead electrode having, in a plan view, a first region, a second region surrounding a periphery of the first region and having a width of 110 µm or more and a thickness greater than that of the first region, and a third region surrounding at least a portion of a periphery of the second region and having a thickness smaller than that of the second region, the first lead electrode forming a portion of a bottom surface of a recess, the second lead electrode having, in a plan view, a fourth region, a fifth region surrounding a periphery of the fourth region and having a width of 110 µm or more and a thickness greater than that of the fourth region, the sixth region surrounding at least a portion of a periphery of the fifth region and having a thickness smaller than that of the fifth region, the second lead electrode forming a portion of the bottom surface of the recess; forming a package including the first lead electrode, the second lead electrode, and a resin molded body, the package having a recess, and the step of forming the package including using a mold having an upper mold part having a projection with a shape corresponding to the recess and a lower mold part on which the first lead electrode and the second lead electrode are to be placed, placing the first lead electrode and the second lead electrode in predetermined positions on the lower mold part so that the first lead electrode and the second lead electrode are set between the upper mold part and the lower mold part and that the second region and the fifth region abut the upper mold part, pressing the upper mold part against the first lead and the second lead electrode; injecting a resin into the mold that is in contact with the first lead electrode and the second lead electrode; curing the injected resin to harden the resin molded body; and removing the upper mold part from the lower mold part.

Still further, a method of manufacturing a light emitting device according to certain embodiments of the present disclosure includes manufacturing a package for mounting a light emitting element according to the method of manufacturing a package and mounting the light emitting element on the first region.

In the package and the light emitting device according to the embodiments of the present disclosure, generation of burrs can be suppressed. Further, the methods of manufacturing a package for mounting a light emitting element provide easy manufacturing of a package and a light emitting device in which generation of burrs is suppressed.

DETAILED DESCRIPTION OF EMBODIMENTS

Embodiment

Figure 1:
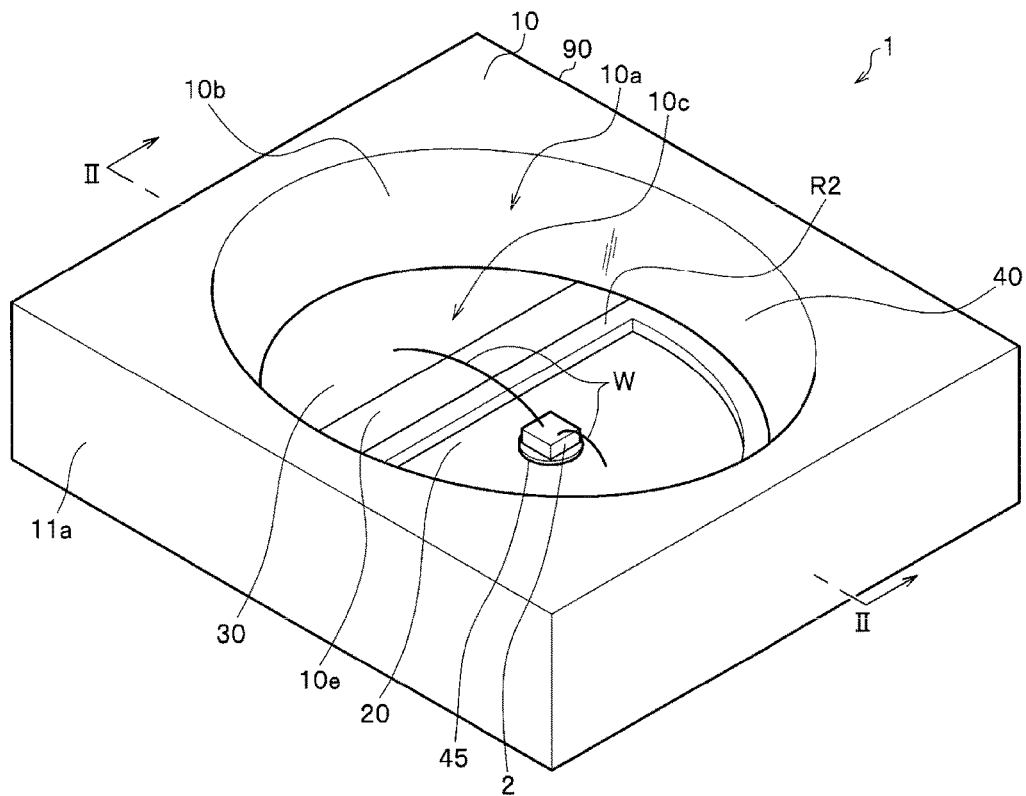
FIG. 1 is a schematic diagram of a cross section of a light emitting device according to a first embodiment.

In the following, embodiments will be described with reference to the drawings. The embodiments described below each exemplify a light emitting device for embodying the technical idea of the present invention, and the technical idea of the present invention is not limited to that described below. Further, the size, material, shape, relative arrangement and the like of constituent components described in the embodiments are not intended to limit the scope of the present invention thereto unless otherwise specified, and they are merely examples. Note that, the size, positional relationship and the like in the drawings may be exaggerated for the sake of clarity.

First Embodiment

Figure 2:
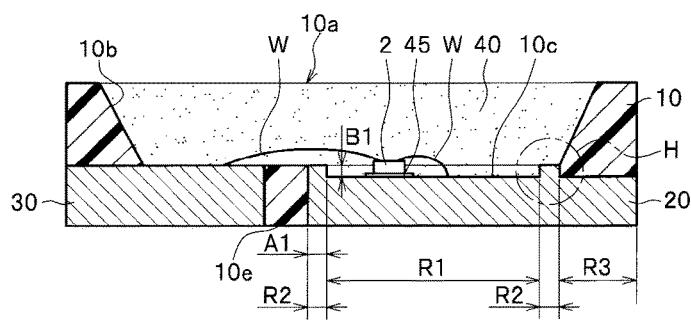
FIG. 2 is a schematic diagram of a cross section of the light emitting device according to the first embodiment taken along line II-II in FIG. 1.
Figure 3:
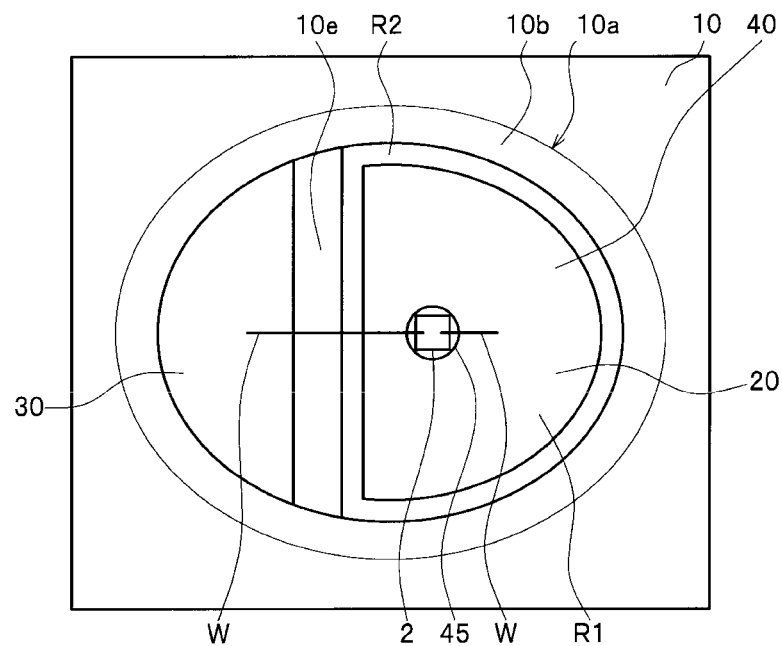
FIG. 3 is a schematic diagram of a top view of the light emitting device according to the first embodiment.
Figure 4:
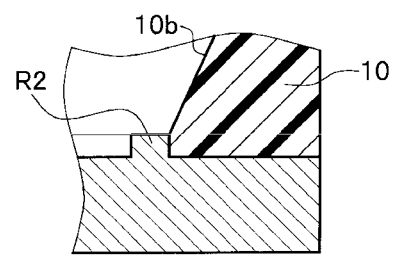
FIG. 4 is an enlarged sectional view of part H in FIG. 2.

FIG. 1 is a schematic diagram of a cross section of a light emitting device according to a first embodiment. FIG. 2 is a schematic diagram of a cross section of the light emitting device according to the first embodiment taken along line II-II in FIG. 1. FIG. 3 is a schematic diagram of a top view of the light emitting device according to the first embodiment. FIG. 4 is an enlarged sectional view of part H in FIG. 2.

The light emitting device 1 includes a package 90, a light emitting element 2, wires W, and a sealing member 40.

The package 90 includes a pair of lead electrodes 20 and 30 made of metal plates, and a resin molded body 10. The package 90 is provided with a recess 10a for mounting the light emitting element 2. The pair of lead electrodes 20 and 30 are exposed at the recess 10a.

The shape of the whole package 90 is a substantially rectangular parallelepiped. At the upper surface of the package 90, the cup-shaped recess (a cavity) 10a for mounting the light emitting element 2 is formed. The package 90 is integrally retained by the resin molded body 10 such that the pair of lead electrodes 20 and 30 made of metal plates are exposed outside the resin molded body 10 and on a bottom surface 10c of the recess 10a.

The resin molded body 10 fixes part of the first lead electrode 20 and a portion of the second lead electrode 30, and forms at least a portion of a lateral surface 10b of the recess 10a. Further, the resin molded body 10 is formed such that the first lead electrode 20 and the second lead electrode 30 are interposed between two sides of the rectangle in a plan view. Thus, the resin molded body 10 fixes the first lead electrode 20 and the second lead electrode 30, spaced apart from each other, to the bottom surface 10c of the recess 10a.

The height, length, and width of the resin molded body 10 can be selected as appropriate in accordance with the purpose and the intended use. Examples of the material of the resin molded body 10 include thermoplastic resin and thermosetting resin. The thermoplastic resin may be, for example, polyphthalamide resin, liquid crystal polymer, polybutylene terephthalate (PBT), unsaturated polyester or the like. The thermosetting resin may be, for example, epoxy resin, modified epoxy resin, silicone resin, modified silicone resin or the like.

The recess 10a is defined by the lateral surface 10b and the bottom surface 10c with a shape of an elliptical frustum narrowing toward the bottom surface 10c. The light emitted by the light emitting element 2 is reflected by the lateral surface 10b. The light can be condensed or diffused by changing the angle of the lateral surface 10b as appropriate. The bottom surface 10c is made up of the first lead electrode 20, the second lead electrode 30, and a gap 10e that is part of the resin molded body 10. The gap 10e is provided between the first lead electrode 20 and the second lead electrode 30 such that the first lead electrode 20 and the second lead electrode 30 are not short-circuited.

In order for the lateral surface 10b of the recess 10a to efficiently reflect light, the resin molded body 10 may contain a light reflective member. The light reflective member is a material exhibiting high light reflectivity, such as white filler of titanium oxide, glass filler, silica, alumina, zinc oxide or the like. A visible light reflectivity of 70% or more, preferably 80% or more is preferable. In particular, a reflectivity of 70% or more or 80% or more in the wavelength band of light emitted by the light emitting element is preferable. The content of titanium oxide or the like may be from 5 weight % to 50 weight % inclusive, and preferably from 10 weight % to 30 weight % inclusive. However, the embodiments of the present invention are not limited thereto.

The first lead electrode 20 refers to a lead portion positioned inside and under the resin molded body 10 in a plan view. The shape of the first lead electrode 20 is substantially a quadrangle in a plan view. However, the shape thereof is not limited thereto, and the first lead electrode 20 may be partially provided with a cutout, a recess, a projection or the like.

The second lead electrode 30 refers to a lead portion positioned inside and under the resin molded body 10 in a plan view. The shape of the second lead electrode 30 is substantially a quadrangle in a plan view. However, the shape thereof is not limited thereto, and the second lead electrode 30 may be partially provided with a cutout, a recess, a projection or the like.

The first lead electrode 20 and the second lead electrode 30 are arranged as being spaced apart from each other by the gap 10e of the resin molded body 10, and used as the anode electrode and the cathode electrode when the light emitting device is in use.

Note that, herein, though the first lead electrode 20 is formed to be longer than the second lead electrode 30, the length, width, and thickness of the first lead electrode 20 and the second lead electrode 30 are not particularly limited, and can be selected as appropriate in accordance with the purpose and the intended use. The first lead electrode 20 and the second lead electrode 30 are formed using electrically conductive material such as iron, copper, phosphor bronze, copper alloy or the like. Further, in order to enhance reflectivity of light from the light emitting element 2, the first lead electrode 20 and the second lead electrode 30 may be metal-plated with gold, silver, copper, aluminum or the like.

The first lead electrode 20 forms part of the bottom surface 10c of the recess 10a. In a plan view, the first lead electrode 20 has a first region R1, a second region R2 that is thicker than the first region R1, and a third region R3 formed at least at part of the outer circumference of the second region R2 and being thinner than the second region R2.

The first region R1 is the portion where the light emitting element 2 is bonded by die-bonding. The second region R2 is formed at the boundary between the portion where the light emitting element 2 is bonded and the resin molded body 10 in the first lead electrode 20.

Specifically, part of the second region R2 is formed along the lateral surface of the resin molded body 10 forming the lateral surface 10b of the recess 10a, and part of the second region R2 is formed along the gap 10e connecting the first lead electrode 20 and the second lead electrode 30.

The lateral surface 10b of the recess 10a is connected continuously to an outer corner portion of the second region R2. That is, in a cross-sectional view, the lower portion of the lateral surface 10b of the recess 10a is in contact with the position of the outer corner portion of the second region R2, such that the upper surface of the second region R2 and the lateral surface 10b of the recess 10a are continuous to each other.

The third region R3 has the same thickness as the first region R1.

The second lead electrode 30 forms part of the bottom surface 10c of the recess 10a. The upper surface of the second lead electrode 30 is flat, and partially provided with the resin molded body 10.

Herein, the second region R2 is annularly formed so as to surround the region for mounting the light emitting element 2. The region for mounting the light emitting element 2 specifically refers to the region in the first lead electrode 20 exposed at the bottom surface 10c of the recess 10a (hereinafter referred to as the "light emitting element mounting region").

The second region R2 can be formed by subjecting the base material itself of the metal plates to work. In the present embodiment, a same material is employed for the pair of lead electrodes 20 and 30 and the second region R2, and the second region R2 is integrally formed with the pair of lead electrodes 20 and 30.

A width A1 of the second region R2 is 110 μm or more. By setting the width A1 of the second region R2 to 110 μm or more, the second region R2 can be easily formed. Further, in manufacturing the light emitting device 1, when the width A1 of the second region R2 is 110 μm or more, and resin is injected into the mold, provided that the resin flows onto the upper surface of the second region R2, the resin tends to stop midway on the upper surface of the second region R2. Accordingly, the resin will not easily flow to reach the metal exposed portion on the first lead electrode 20, and the effect of suppressing generation of resin burrs is enhanced. In order to more easily achieve the above-described effects, the width A1 of the second region R2 is preferably 120 μm or more, and more preferably 130 μm or more.

Note that, the metal exposed portion on the first lead electrode 20 is the portion on the first lead electrode 20 at the bottom surface 10c of the recess 10a excluding the second region R2.

Further, the width A1 of the second region R2 is preferably 200 μm or less. In manufacturing the light emitting device 1, when the width A1 of the second region R2 is 200 μm or less, the pressing force is more easily centered at the second region R2 when the pair of lead electrodes 20 and 30 are pressed by the mold. In order to more easily achieve the above-described effect, the width A1 of the second region R2 is more preferably 190 μm or less, and further preferably 180 μm or less.

Note that, the width A1 of the second region R2 is the width excluding the thickness of a plating layer. Further, as will be described later, the thicknesses of metal portions 14 formed by the second region R2 being crushed are not included.

Preferably, the difference between the thickness of the first lead electrode 20 at the first region R1 and the thickness of the first lead electrode 20 at the second region R2 (hereinafter referred to as the "thickness difference") B1 is from 5 μm to 50 μm inclusive. In manufacturing the light emitting device 1, when the thickness difference B1 between the first region R1 and the second region R2 is 5 μm or more, as will be described later, and the pair of lead electrodes 20 and 30 are pressed by the mold, the possibility of the upper mold part being brought into contact with the metal exposed portion of the first lead electrode 20 becomes smaller. On the other hand, when the thickness difference B1 between the first region R1 and the second region R2 is 50 μm or less, the thickness of the entire pair of lead electrodes 20 and 30 can be reduced. In order to more easily achieve the effect described above, the thickness difference B1 between the first region R1 and the second region R2 is more preferably 10 μm or more, and further preferably 15 μm or more. Further, in order to further easily achieve the above-described effect, the thickness difference B1 between the first region R1 and the second region R2 is more preferably 45 μm or less, and further preferably 40 μm or less.

Note that, the thickness difference B1 between the first region R1 and the second region R2 in the light emitting device 1 is the thickness difference between the first region R1 and the second region R2 after the package 90 is manufactured, and is the thickness difference from which the thickness of the plating layer is removed.

Further, the width and thickness of the second region R2 are changed as appropriate depending on the material of the first lead electrode 20 and the second lead electrode 30, the size of the resin molded body 10 and the like.

The light emitting element 2 is mounted on the first lead electrode 20 of the package 90. The shape or size of the light emitting element 2 used herein is not particularly limited. As to the color of light emitted by the light emitting element 2, an arbitrary wavelength can be selected in accordance with the intended use. For example, as a light emitting element of blue (wavelength 430 nm to 490 nm), GaN-base or InGaN-base may be employed. The InGaN-base may be $In_XAl_YGa_{1-X-Y}N$ ($0 \leq X \leq 1$, $0 \leq Y \leq 1$, $X+Y<1$) or the like.

The wires W are electrically conductive wires for electrically connecting the light emitting element 2 and electrical components such as a protective element to the first lead electrode 20 and the second lead electrode 30. The material of the wires W may be metal such as Au (gold), Ag (silver), Cu (copper), Pt (platinum), Al (aluminum) or the like, and alloy thereof. Particularly, Au being excellent in thermal conductivity and the like is preferable. Note that, the thickness of the wire W is not particularly limited, and can be selected as appropriate in accordance with the purpose and the intended use.

The sealing member 40 is provided in the recess 10a of the package 90 so as to cover the light emitting element 2 and the like. The sealing member 40 is provided for protecting the light emitting element 2 and the like from an external force, dust, moisture and the like, and to improve the heat resistance, weather resistance, and lightfastness of the light emitting element 2 and the like. The material of the sealing member 40 may be a thermosetting resin, e.g., a transparent material such as silicone resin, epoxy resin, urea resin or the like. In addition to such a material, for obtaining a prescribed function, a fluorescent material or filler of a substance exhibiting high light reflectivity may be added to the sealing member 40.

For example, by mixing the sealing member 40 and a fluorescent material, color-tone adjustment of the light emitting device 1 can be easily achieved. Note that, such a fluorescent material may be greater in specific gravity than the sealing member 40, and absorb the light from the light emitting element 2 to convert the wavelength. When the fluorescent material is greater in specific gravity than the sealing member 40, it precipitates toward the first lead electrode 20 and the second lead electrode 30 and therefore, it is preferable. Specifically, for example, a yellow fluorescent material such as YAG ($Y_3Al_5O_{12}$:Ce), silicate or the like, a red fluorescent material such as CASN ($CaAlSiN_3$:Eu) or KSF ($K_2SiF_6$:Mn) or the like, or a green fluorescent material such as chlorosilicate, $BaSiO_4$:$Eu^{2+}$ or the like may be used.

As the filler contained in the sealing member 40, for example, a substance exhibiting high light reflectivity such as $SiO_2$, $TiO_2$, $Al_2O_3$, $ZrO_2$, MgO or the like may be suitably used. Further, for the purpose of cutting undesired wavelengths, for example, an inorganic or organic coloring dye or coloring pigment may be used.

Second Embodiment

A description will be given of a light emitting device 1A according to a second embodiment, mainly focusing on the differences from the light emitting device 1 according to the first embodiment.

Figure 5:
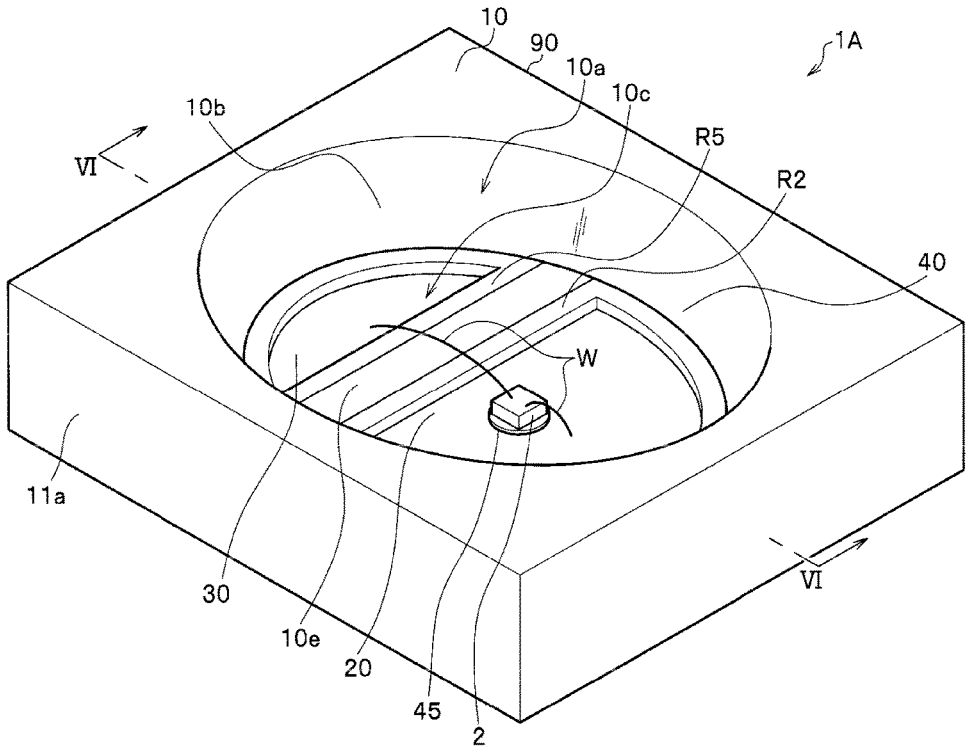
FIG. 5 is a schematic diagram of a perspective view showing an entire light emitting device according to a second embodiment.
Figure 6:
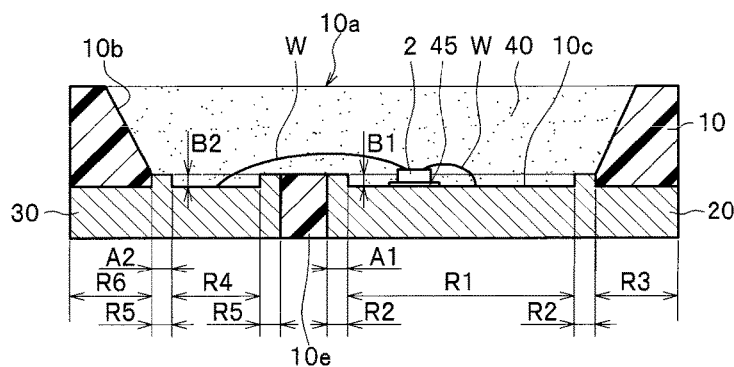
FIG. 6 is a schematic diagram of a cross-section of the light emitting device according to the second embodiment taken along line VI-VI in FIG. 5.
Figure 7:
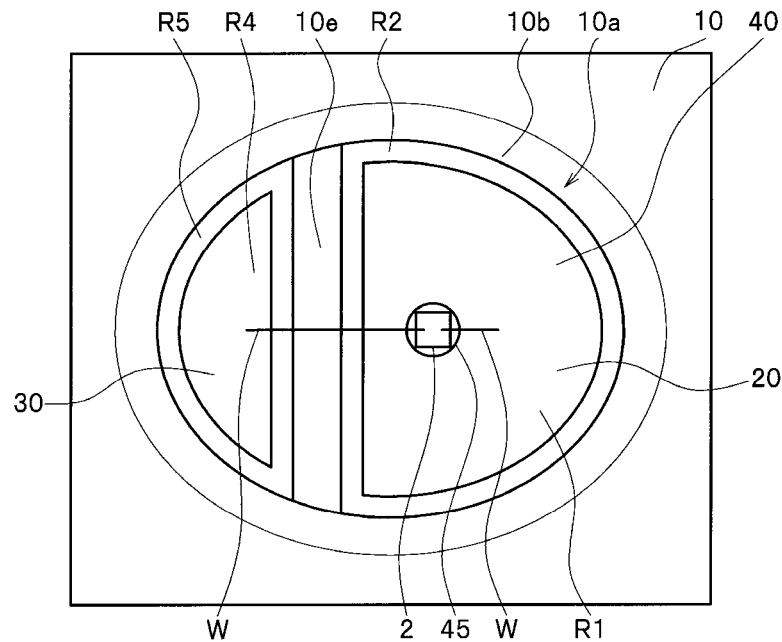
FIG. 7 is a schematic diagram of a top view of the light emitting device according to the second embodiment.

FIG. 5 is a schematic diagram of a perspective view showing an entire light emitting device according to a second embodiment. FIG. 6 is a schematic diagram of a cross-section of the light emitting device according to the second embodiment taken along line VI-VI in FIG. 5. FIG. 7 is a schematic diagram of a top view of the light emitting device according to the second embodiment.

In a plan view, the second lead electrode 30 has a fourth region R4, a fifth region R5 surrounding a periphery of the fourth region R4 and having a thickness greater than that of the fourth region R4, and a sixth region R6 surrounding at least a portion of a periphery of the fifth region R5 and having a thickness smaller than that of the fifth region R5.

The fourth region R4 is the portion subjected to wire bonding. The fifth region R5 is formed at the boundary between the portion subjected to wire bonding and the resin molded body 10 in the second lead electrode 30.

Specifically, part of the fifth region R5 is formed along the lateral surface of the resin molded body 10 forming the lateral surface 10b of the recess 10a, and part of the fifth region R5 is formed along the gap 10e connecting the first lead electrode 20 and the second lead electrode 30.

The lateral surface 10b of the recess 10a is connected continuously to an outer corner portion of the fifth region R5. That is, in a cross-sectional view, the lower portion of the lateral surface 10b of the recess 10a is in contact with the position of the outer corner portion of the fifth region R5, such that the upper surface of the fifth region R5 and the lateral surface 10b of the recess 10a are continuous to each other.

The sixth region R6 has the same thickness as the fourth region R4.

A width A2 of the fifth region R5 is 110 µm or more. By setting the width A2 of the fifth region R5 to 110 µm or more, the fifth region R5 can be easily formed. Further, in manufacturing the light emitting device 1A, when the width A2 of the fifth region R5 is 110 µm or more, and resin is injected into the mold, provided that the resin flows into fifth region R5, the resin tends to stop midway on the upper surface of the fifth region R5. Accordingly, the resin will not easily flow to reach the metal exposed portion on the second lead electrode 30, and the effect of suppressing generation of resin burrs is enhanced. In order to more easily achieve the above-described effects, the width A2 of the fifth region R5 is preferably 120 µm or more, and more preferably 130 µm or more.

Note that, the metal exposed portion on the second lead electrode 30 is the portion on the second lead electrode 30 at the bottom surface 10c of the recess 10a excluding the fifth region R5.

Further, the width A2 of the fifth region R5 is preferably 200 µm or less. In manufacturing the light emitting device 1A, when the width A2 of the fifth region R5 is 200 µm or less, the pressing force is more easily centered at the fifth region R5 when the pair of lead electrodes 20 and 30 are pressed by the mold. In order to more easily achieve the above-described effect, the width A2 of the fifth region R5 is more preferably 190 µm or less, and further preferably 180 µm or less.

Note that, the width A2 of the fifth region R5 is the width excluding the thickness of a plating layer. Further, as will be described later, the thicknesses of metal portions 14 formed by the fifth region R5 being crushed are not included.

Preferably, the difference between the thickness of the second lead electrode 30 at the fourth region R4 and the thickness of the second lead electrode 30 at the fifth region R5 (hereinafter referred to as the "thickness difference") B2 is from 5 µm to 50 µm inclusive. In manufacturing the light emitting device 1A, when the thickness difference B2 between the fourth region R4 and the fifth region R5 is 5 µm or more, as will be described later, and the pair of lead electrodes 20 and 30 are pressed by the mold, the possibility of the upper mold part being brought into contact with the metal exposed portion of the second lead electrode 30 becomes smaller. On the other hand, when the thickness difference B2 between the fourth region R4 and the fifth region R5 is 50 µm or less, the thickness of the entire pair of lead electrodes 20 and 30 can be reduced. In order to more easily achieve the effect described above, the thickness difference B2 between the fourth region R4 and the fifth region R5 is more preferably 10 µm or more, and further preferably 15 µm or more. Further, in order to further easily achieve the above-described effect, the thickness difference B2 between the fourth region R4 and the fifth region R5 is more preferably 45 µm or less, and further preferably 40 µm or less.

Note that, the thickness difference B2 between the fourth region R4 and the fifth region R5 in the light emitting device 1A is the thickness difference between the fourth region R4 and the fifth region R5 after the package 90 is manufactured, and is the thickness difference from which the thickness of the plating layer is removed.

Further, the width and thickness of the fifth region R5 are changed as appropriate depending on the material of the first lead electrode 20 and the second lead electrode 30, the size of the resin molded body 10 and the like.

Method of Manufacturing Light Emitting Device

Figure 8:
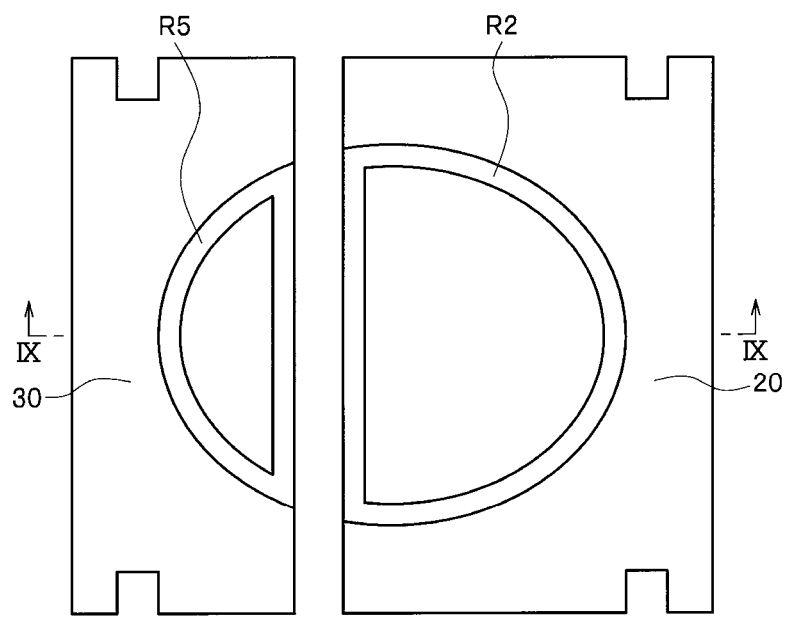
FIG. 8 is a schematic diagram of a top view of a lead frame in a step of manufacturing the light emitting device according to the second embodiment.
Figure 9:
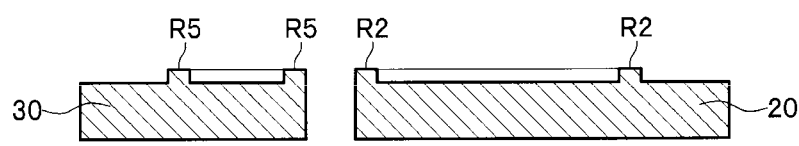
FIG. 9 is a schematic diagram of a top view of a lead frame in a step of manufacturing the light emitting device according to the second embodiment, taken along line IX-IX in FIG. 8.
Figure 10:
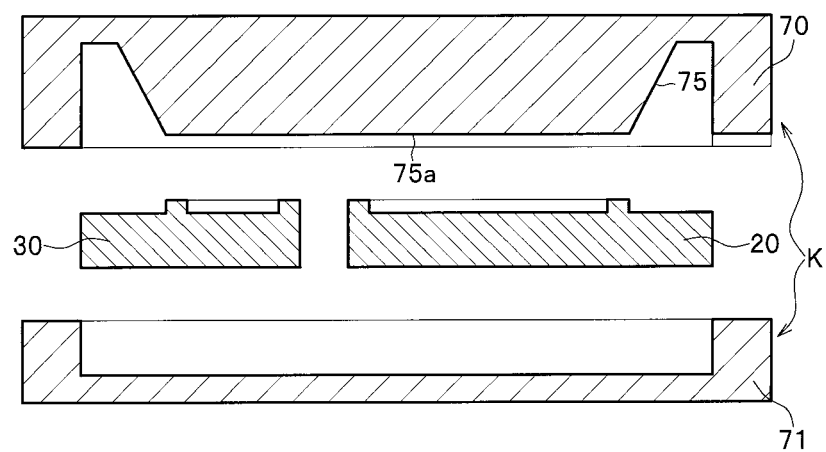
FIG. 10 is a schematic diagram showing an arrangement of lead electrodes and the mold at the position corresponding to line VI-VI in FIG. 5 in a step of manufacturing the light emitting device according to the second embodiment.
Figure 11:
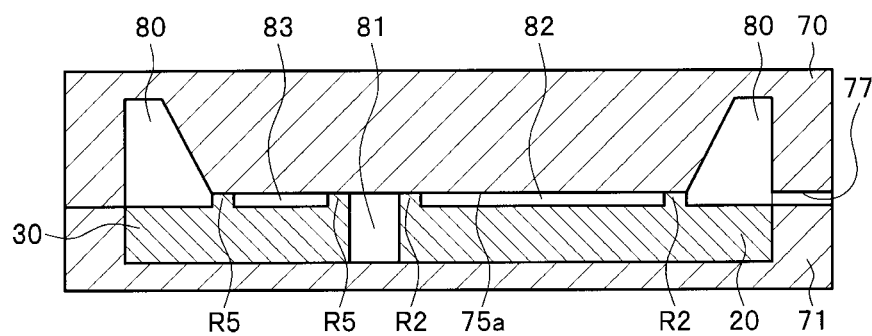
FIG. 11 is a schematic diagram of a cross-section showing the lead electrodes placed between and held by the upper mold part and the lower mold part, in a step of manufacturing a package for mounting a light emitting element according to the second embodiment.
Figure 12:
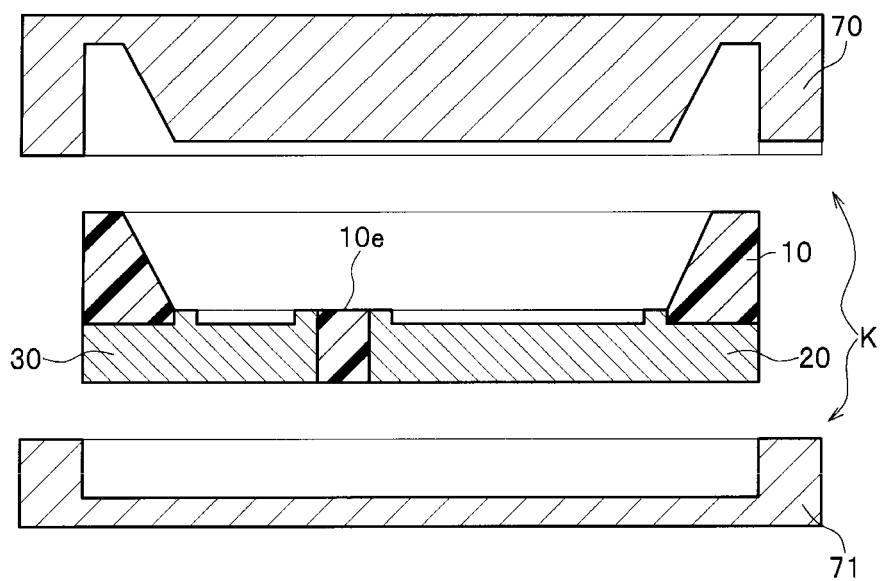
FIG. 12 is a schematic diagram of a cross-section of a package after removing the mold, in a step of manufacturing the package according to the second embodiment.
Figure 13:
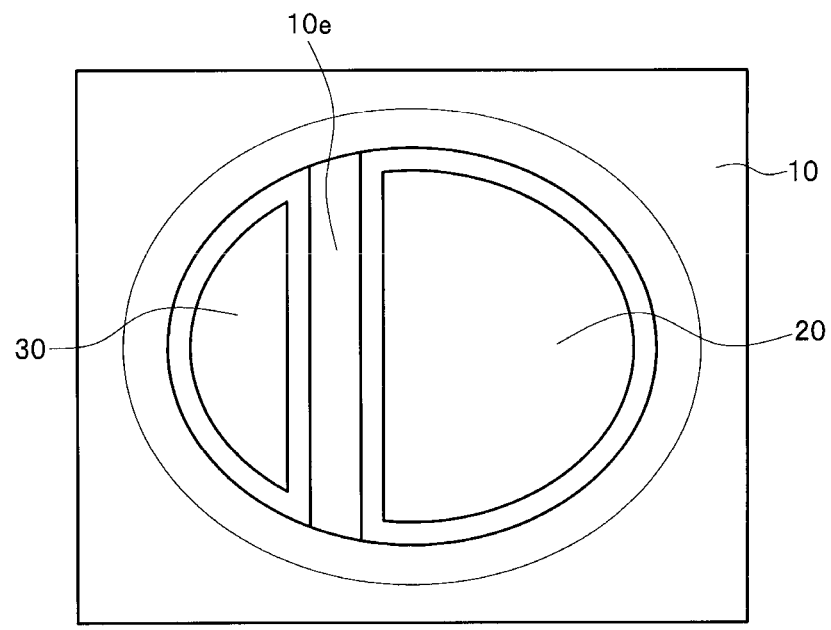
FIG. 13 is a schematic diagram of a top view of a package after removing the mold, in a step of manufacturing the package according to the second embodiment.

Next, a method of manufacturing the light emitting device according to the present embodiment will be described. Note that, herein, a description will be exemplarily given on a method of manufacturing the light emitting device 1A according to the second embodiment. FIG. 8 is a schematic diagram of a top view of a lead frame in a step of manufacturing the light emitting device according to the second embodiment. FIG. 9 is a schematic diagram of a top view of a lead frame in a step of manufacturing the light emitting device according to the second embodiment, taken along line IX-IX in FIG. 8. FIG. 10 is a schematic diagram showing an arrangement of lead electrodes and the mold at the position corresponding to line VI-VI in FIG. 5 in a step of manufacturing the light emitting device according to the second embodiment. FIG. 11 is a schematic diagram of a cross-section showing the lead electrodes placed between and held by the upper mold part and the lower mold part, in a step of manufacturing a package for mounting a light emitting element according to the second embodiment. FIG. 12 is a schematic diagram of a cross-section of a package after removing the mold, in a step of manufacturing the package according to the second embodiment. FIG. 13 is a schematic diagram of a top view of a package after removing the mold, in a step of manufacturing the package according to the second embodiment.

Figure 14:
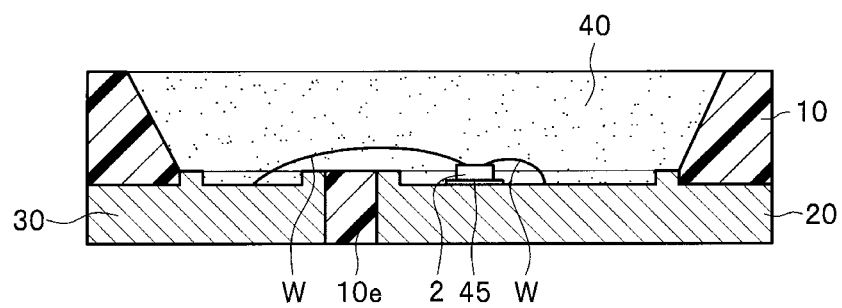
FIG. 14 is a schematic diagram of a cross-section showing a state in which a light emitting element is mounted, in a step of manufacturing the light emitting device according to the second embodiment.
Figure 15:
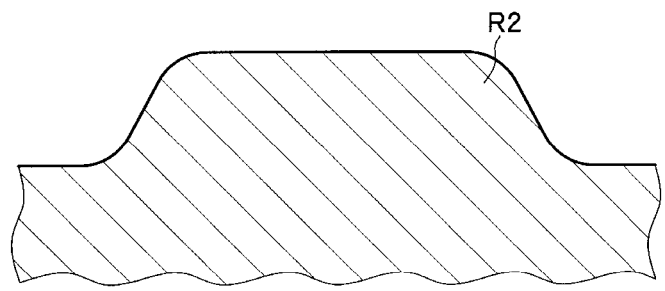
FIG. 15 is a schematic diagram of a second region formed by etching in the light emitting device according to the second embodiment.
Figure 16:
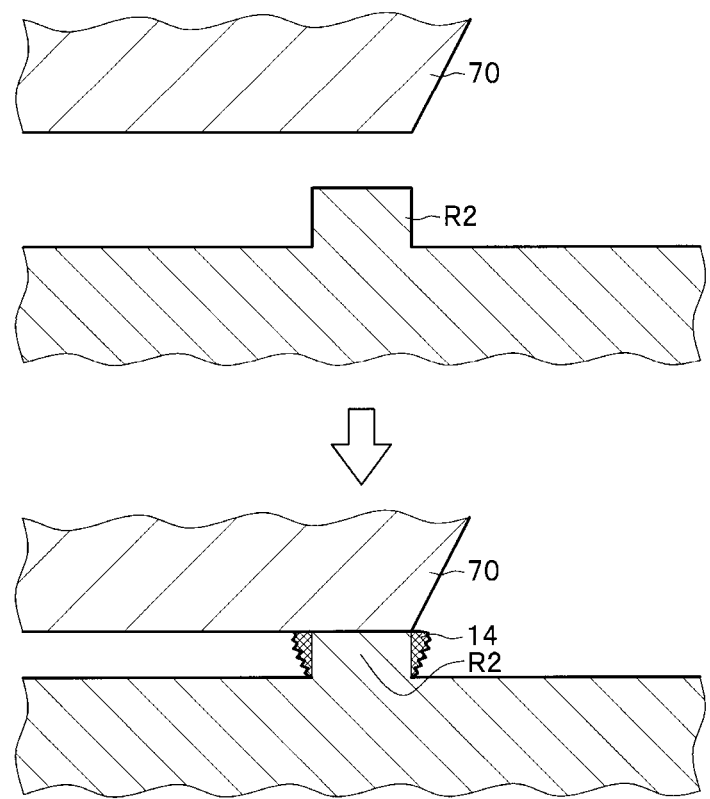
FIG. 16 is a schematic cross-sectional view showing a state of the second region before and after being placed between the upper mold part and the lower mold part and pressed by the mold, in a package according to the second embodiment.
Figure 17:
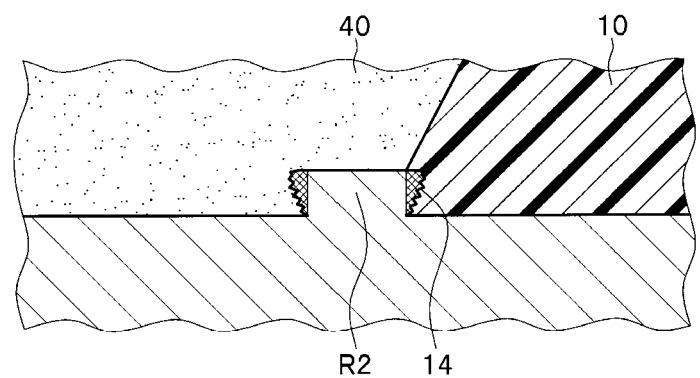
FIG. 17 is a schematic cross-sectional view showing a relationship between the second region provided with a metal portion and a sealing member in the light emitting device according to the second embodiment.

FIG. 14 is a schematic diagram of a cross-section showing state in which a light emitting element is mounted, in a step of manufacturing the light emitting device according to the second embodiment. FIG. 15 is a schematic diagram of a second region formed by etching in the light emitting device according to the second embodiment. FIG. 16 is a schematic cross-sectional view showing the states of the second region before and after being placed between the upper mold part and the lower mold part and pressed by the mold, in a package according to the second embodiment. FIG. 17 is a schematic cross-sectional view showing to relationship between the second region provided with a metal portion and a sealing member in the light emitting device according to the second embodiment.

Herein, a description will be given on the case where a single package is manufactured.

The method of manufacturing the light emitting device 1A according to the present embodiment includes, as one example, the following first to eighth steps.

The first step is a step of preparing the first lead electrode 20 and the second lead electrode 30.

The structure of the first lead electrode 20 and the second lead electrode 30 are as described above, and as shown in FIGS. 8 and 9, the second region R2 and the fifth region R5 are previously formed.

The second region R2 and the fifth region R5 can be formed by subjecting the base material itself of the metal plates to work such as, for example, etching or pressing.

When the second region R2 and the fifth region R5 are formed by etching, the pair of lead electrodes 20 and 30 are covered by a mask of a prescribed shape, and immersed in etchant. Therefore, the lateral surface of the second region R2 and the fifth region R5 become slightly rounded (see FIG. 15). On the other hand, when the second region R2 and the fifth region R5 are formed by pressing, the lateral surface of the second region R2 and the fifth region R5 become perpendicular and provided with corners (see FIG. 6).

Further, the second region R2 and the fifth region R5 crush when pressed by the mold, depending on the pressing pressure. Therefore, the thickness of the second region R2 and the fifth region R5 is preferably designed such that the thickness difference B1 between the first region R1 and the second region R2 and the thickness difference B2 between the fourth region R4 and the fifth region R5 become 5 μm to 50 μm inclusive, taking into consideration the pressing pressure in pressing.

Then, prior to performing the second step, as shown in FIG. 10, the first lead electrode 20 and the second lead electrode 30 are arranged between the upper mold part 70 and the lower mold part 71. The first lead electrode 20 and the second lead electrode 30 are arranged as being spaced apart from each other by the gap 10e (see FIG. 2) for preventing short-circuiting. Note that, the upper mold part 70 has a projection 75 corresponding to the shape of the recess 10a, in order to form the recess 10a for storing the light emitting element 2 by the pair of lead electrodes 20 and 30 and the resin molded body 10.

The second step is a step of, for example, using a package-manufacturing purpose mold K, pressing the pair of lead electrodes 20 and 30 so as to allow the second region R2 and the fifth region R5 to abut the upper mold part 70. Here, as shown in FIG. 11, the first lead electrode 20 and the second lead electrode 30 are pressed between the upper mold part 70 and the lower mold part 71.

Specifically, a bottom surface 75a formed at the projection 75 of the upper mold part 70 abuts the second region R2 of the first lead electrode 20 and the fifth region R5 of the second lead electrode 30. Thus, by the upper mold part 70 and the lower mold part 71, cavities 80 and 81 are formed.

In the second step, the first lead electrode 20 and the second lead electrode 30 are pressed by the mold with a pressing force with which contact between the bottom surface 75a formed at the projection 75 of the upper mold part 70 and the metal exposed portion of the first lead electrode 20 and the metal exposed portion of the second lead electrode 30 is avoided. At this time, though the second region R2 and the fifth region R5 crush when being pressed, depending on the pressing pressure, the bottom surface 75a does not abut the metal exposed portion of the first lead electrode 20, and hence a cavity 82 is formed. Similarly, since the bottom surface 75a does not abut the metal exposed portion of the second lead electrode 30, a cavity 83 is formed.

In the second step, pressing is preferably performed such that the thickness difference B1 between the first region R1 and the second region R2 and the thickness difference B2 between the fourth region R4 and the fifth region R5 in the manufactured light emitting device 1A become 5 μm to 50 μm inclusive.

The third step is a step of injecting resin into the package-manufacturing purpose mold K pressing the pair of lead electrodes 20 and 30. Herein, the resin is injected into the cavities 80 and 81 formed by the upper mold part 70 and the lower mold part 71 from an injection port 77 by transfer molding. In the third step, since the first lead electrode 20 and the second lead electrode 30 are pressed by the upper mold part 70 and the lower mold part 71, the first lead electrode 20 and the second lead electrode 30 do not flap when the resin is injected. Thus, generation of burrs can be suppressed. Note that, since the pair of lead electrodes 20 and 30 are provided with the second region R2 and the fifth region R5, the resin is less prone to enter the cavities 82 and 83.

The fourth step is a step of forming the resin molded body 10 by curing the resin injected into the package-manufacturing purpose mold K. Herein, when thermosetting resin such as epoxy resin is injected as the resin, for example, the upper mold part 70 and the lower mold part 71 are heated to thereby heat the resin for a prescribed period, to allow the resin to cure. Note that, when thermoplastic resin such as polyphthalamide resin, for example, is injected, molding can be achieved through injection molding. In this case, the thermoplastic resin may be melted under high temperatures, and put into a low-temperature mold and allowed to cure by being cooled.

The fifth step is a step of removing the upper mold part 70 and the lower mold part 71. Herein, for example as shown in FIG. 12, the upper mold part 70 and the lower mold part 71 are removed. Thus, as shown in FIGS. 12 and 13, the package in which the first lead electrode 20 and the second lead electrode 30 are integrally retained by the resin molded body 10 is completed.

Note that, when the resin is cured in the fourth step, a gate is molded at the injection port 77 portion of the mold. This gate is cut by a known cutting machine along the outer surface 11a of the resin molded body 10 after the mold is removed (the fifth step).

Note that, FIGS. 12 and 13 show the package after the gate is cut off.

The sixth step is a step of mounting the light emitting element 2 in the recess 10a formed at the package 90. In the present embodiment, the light emitting element 2 is an element having the one-surface electrode structure in which a pair of n-electrode and p-electrode are formed on the upper surface. In this case, as shown in FIG. 14, the back surface of the light emitting element 2 is bonded to the first lead electrode 20 by an insulating die-bonding member 45. One electrode on the upper surface of the light emitting element 2 is connected to the first lead electrode 20 by the wire W, and the other electrode on the upper surface of the light emitting element 2 is connected to the second lead electrode 30 by the wire W.

The seventh step is a step of packing the sealing member 40 into the recess 10a of the package 90 so as to cover the light emitting element 2. Here, as shown in FIG. 14, the sealing member 40 is applied inside the recess 10a surrounded by the resin molded body 10 of the package 90, to thereby seal the light emitting element 2. At this time, the sealing member 40 is dripped to reach the upper surface of the recess 10a of the resin molded body 10. The sealing member 40 may be packed into the recess 10a of the resin molded body 10 by, for example, injection, compression, or extrusion. It is preferable that a fluorescent material is previously mixed with the sealing member 40. Thus, the color of the light emitting device can be adjusted easily.

The eighth step is a step of curing the sealing member 40 packed into the recess 10a. Here, when thermosetting resin such as silicone resin, for example, is injected as the sealing member 40, the resin is heated for a prescribed period and cured.

Through the foregoing steps, the light emitting device 1A can be formed.

In the embodiment described above, the case where a single package is manufactured has been shown. However, it is also possible to employ a lead frame in which a plurality of pairs of metal plates, each pair of metal plates being the pair of the first lead electrode 20 and the second lead electrode 30, are connected by suspension leads. In this case, the pair of metal plates on the lead frame are referred to as the first lead electrode 20 and the second lead electrode 30.

Then, in the case where the lead frame in which a plurality of pairs of metal plates are connected is employed, the following ninth step is performed following the above-described first to eighth steps.

The ninth step is a step of cutting off the package 90 from the lead frame. Herein, the resin molded body 10 and the pair of lead electrodes 20 and 30 are cut off from the lead frame, whereby the package 90 is singulated. Here, for example, a lead cutter may be used as a jig for cutting the suspension leads of the lead frame.

Thus, the light emitting device 1A can be formed.

Note that, in the above-described manufacturing method, the method of manufacturing the light emitting device 1A according to the second embodiment has been described. On the other hand, in the case where the light emitting device 1 according to the first embodiment is manufactured, the second lead electrode 30 that is not provided with the fifth region R5 is used. Accordingly, in the second step, the bottom surface 75a formed at the projection 75 of the upper mold part 70 is brought into contact with the second lead electrode 30, and the cavity 83 is not formed. The rest of the process is similar to the method of manufacturing the light emitting device 1A.

As has been described in the foregoing, with the method of manufacturing a package employed for manufacturing the package according to the embodiments, as shown in FIGS. 11 and 12, the first lead electrode 20 and the second lead electrode 30 are pressed by the upper mold part 70 and the lower mold part 71. When the resin is injected, the pressed area is smaller than that in the case where the second region R2 and the fifth region R5 do not exist at the lead electrodes. Accordingly, the pressing force is centered at the second region R2 and the fifth region R5, and the upper mold part 70 and the lower mold part 71 are brought into intimate contact with the first lead electrode 20 and the second lead electrode 30.

Accordingly, the resin will not easily flow into the cavities 82 and 83, that is, onto the metal exposed portions on the first lead electrode 20 and the second lead electrode 30. Thus, with the package and the light emitting device according to the second embodiment, generation of burrs can be suppressed.

Accordingly, a step of removing burrs of the bottom surface 10c of the recess 10a, which is otherwise conventionally required after the step of molding the package, can be eliminated. Therefore, according to the methods of manufacturing the package and the light emitting device according to the embodiments of the invention, the package and the light emitting device with which generation of burrs can be suppressed can be manufactured easily. As a result, a reduction in costs and lead time can be achieved.

In addition, in the conventional case where the second region R2 and the fifth region R5 do not exist at the lead electrodes, when the lead frame is pressed by the mold, marks resulting from the work using the mold remain, and the degree of a shine of the plating of the first lead electrode 20 and the second lead electrode 30 is changed by the pressing pressure and heat of the mold. Accordingly, even when the degree of a shine of the plating of the first lead electrode 20 and the second lead electrode 30 is increased before molding, the degree of a shine is reduced after molding. Then, the luminous flux of the LED is reduced, and the output is also reduced.

However, since the second region R2 and the fifth region R5 exist at the first lead electrode 20 and the second lead electrode 30 according to the second embodiment of the invention, the bottom surface 75a formed at the projection 75 of the upper mold part 70 will not be brought into contact with the metal exposed portions of the first lead electrode 20 and the second lead electrode 30. Therefore, molding can be achieved without reducing the degree of a shine of the plating of the first lead electrode 20 and the second lead electrode 30. Thus, the conventional problem of a reduction in the output of the LED can be solved.

Further, since the second region R2 and the fifth region R5 exist at the first lead electrode 20 and the second lead electrode 30, the area pressed by the mold is smaller than that in the conventional case. Since the pressing pressure is centered at the second region R2 and the fifth region R5, the number of LEDs that can be manufactured from one lead frame can be increased.

Still further, since the pressing pressure is centered only at the second region R2 and the fifth region R5, the pressing pressure of the package-manufacturing purpose mold K itself can be reduced, for example, to about half as great as that of the conventional mold. As a result, the effect of an increase in the life of the mold apparatus can also be attained.

Still further, since the second region R2 and the fifth region R5 are formed at the first lead electrode 20 and the second lead electrode 30, the contact area relative to the sealing member 40 increases, whereby adhesion to the sealing member 40 improves. Still further, as shown in FIG. 16, since the second region R2 and the fifth region R5 crush when being pressed, part of the metal of the second region R2 and the fifth region R5 squeezes out in the lateral direction, to form a metal portion 14. As shown in FIG. 17, by the sealing member 40 entering below the metal portion 14, the sealing member 40 is prevented from coming off upward. Note that, the annular shape of the second region R2 and the fifth region R5 also contribute to preventing the sealing member 40 from coming off.

Still further, since the package 90 is molded without reducing the degree of a shine of the plating of the metal exposed portions of the first lead electrode 20 and the second lead electrode 30 exposed at the recess 10a, a reduction in the luminous flux of the light emitting device can be suppressed, and a reduction in the output can be prevented.

Still further, since the second region R2 exists at the first lead electrode 20, flow-out (bleeding) of the die-bonding member 45 in mounting the light emitting element 2 can be suppressed. In particular, when a plurality of light emitting elements 2 are mounted, flow-out of the die-bonding member 45 in the lateral direction becomes a concern. However, when the width A1 of the second region R2 is 110 μm or more, the die-bonding member 45 will not easily flow over the second region R2.

Still further, the effect achieved by the light emitting device 1A according to the second embodiment described above can also be achieved by the light emitting device 1 according to the first embodiment, except for the effect achieved by the light emitting device 1A having the fifth region R5.

EXAMPLE

Example 1

In the following, Example 1 of the present invention will be described. Molding was performed using, as shown in FIG. 6, the first lead electrode 20 and the second lead electrode 30 having a width of 150 μm and a height of 25 μm in the second region R2 and the fifth region R5, using a transfer molding machine.

The molding was performed under the conventional pressing pressure and injection pressure conditions with which resin burrs were generated when molding was performed using lead electrodes of a conventional shape without the second region R2 and the fifth region R5. Then, whether or not burrs were produced was checked.

As a result, it was found that burrs were not generated at the metal exposed portions of the first lead electrode 20 and the second lead electrode 30, with the first lead electrode 20 and the second lead electrode 30 provided with the second region R2 and the fifth region R5.

Further, it was found that the bottom surface 75a formed at the projection 75 of the upper mold part 70 was not brought into contact with the metal exposed portion of the second lead electrode 30 exposed at the recess 10a of the package 90. This metal exposed portion is the central portion of the second lead electrode 30 excluding the fifth region R5.

Still further, it was found that the bottom surface 75a formed at the projection 75 of the upper mold part 70 was not brought into contact with the metal exposed portion of the first lead electrode 20 exposed at the recess 10a of the package 90. This metal exposed portion is the central portion of the first lead electrode 20 excluding the second region R2.

Note that, as to the first lead electrode 20 and the second lead electrode 30 provided with the second region R2 and the fifth region R5, formation of the second region R2 and the fifth region R5 was easily performed.

Variations

Next, a description will be given of Variations of the light emitting device according to the present embodiment.

Variation 1

Figure 18:
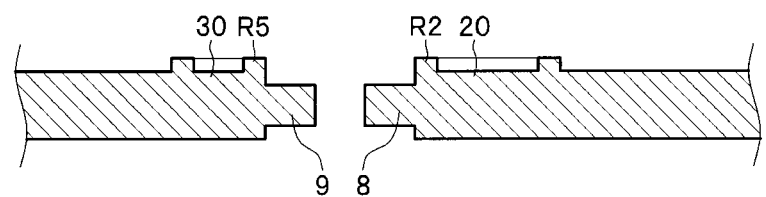
FIG. 18 is a schematic diagram of a cross-section of lead electrodes provided with lateral surface protrusion portions respectively according to Variation 1.
Figure 19:
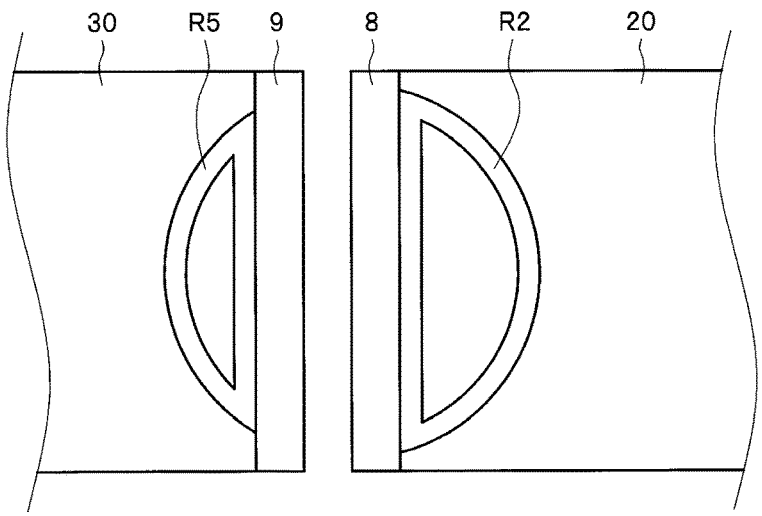
FIG. 19 is a schematic diagram of a top view of the lead electrodes provided with lateral surface protrusion portions respectively according to Variation 1.

FIG. 18 is a schematic diagram of a cross-section of lead electrodes provided with lateral surface protrusion portions respectively according to Variation 1. FIG. 19 is a schematic diagram of a top view of the lead electrodes provided with lateral surface protrusion portions respectively according to Variation 1.

As shown in FIGS. 18 and 19, the first lead electrode 20 and the second lead electrode 30 may be respectively provided with lateral surface protrusions 8 and 9 that are protrusions formed in the width direction of respective lateral surfaces opposing each other, at the center in the height direction of the lateral surfaces. That is, the first lead electrode 20 and the second lead electrode 30 respectively have the lateral surface protrusions 8 and 9 protruding in the horizontal direction at the sites where the pair of lead electrodes 20 and 30 are connected by the resin molded body 10.

The lateral surface protrusion 8 of the first lead electrode 20 is formed by a prescribed thickness at the center in the height direction in a cross-sectional view. Further, in a top view, the lateral surface protrusion 8 of the first lead electrode 20 is formed in the width direction of the first lead electrode 20, that is, in parallel with the longitudinal direction of the gap 10e connecting the first lead electrode 20 and the second lead electrode 30, in the entire width direction of the first lead electrode 20.

The lateral surface protrusion 9 of the second lead electrode 30 is formed by a prescribed thickness at the center in the height direction in a cross-sectional view. Further, in a top view, the lateral surface protrusion 9 of the second lead electrode 30 is formed in the width direction of the second lead electrode 30, that is, in parallel with the longitudinal direction of the gap 10e connecting he first lead electrode 20 and the second lead electrode 30, in the entire width direction of the second lead electrode 30.

The lateral surface protrusions 8 and 9 can be formed in the first lead electrode 20 and the second lead electrode 30, for example, by subjecting the base material itself of the metal plates to work, for example, of etching or pressing.

By providing the lateral surface protrusions 8 and 9 with the package 90, adhesion between the first lead electrode 20, the second lead electrode 30 and the resin molded body 10 improves, and the first lead electrode 20 and the second lead electrode 30 are more firmly fixed to each other.

Note that, the thickness and length of the lateral surface protrusions 8 and 9 are not particularly limited, and should be adjusted as appropriate.

Variation 2

Figure 20:
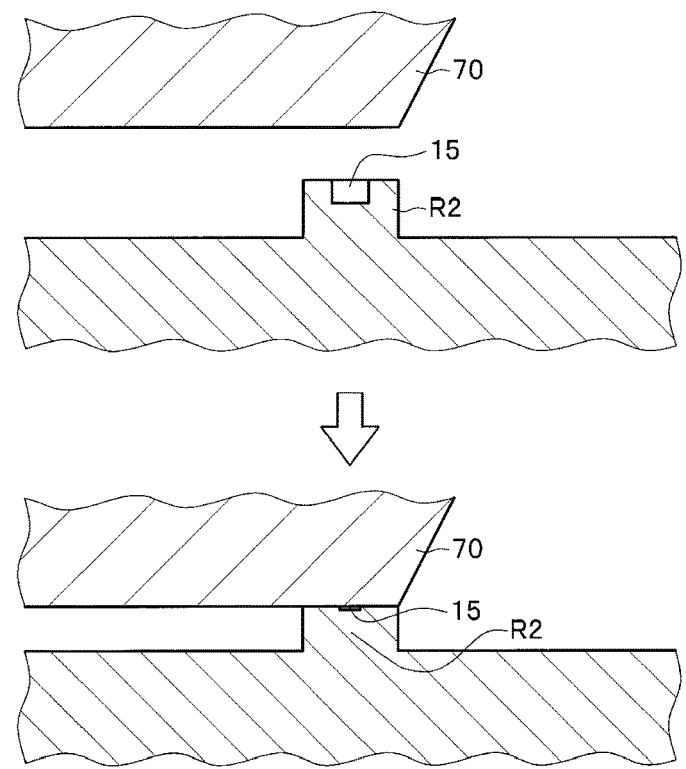
FIG. 20 is schematic a cross-sectional view of the second region provided with a groove, showing a state before and after being placed between the upper mold part and the lower mold part and pressed by the mold according to Variation 2.

FIG. 20 is schematic a cross-sectional view of the second region provided with a groove, showing a state before and after being placed between the upper mold part and the lower mold part and pressed by the mold according to Variation 2.

The light emitting device may have a groove 15 formed along the longitudinal direction of the second region R2 (i.e., the direction perpendicular to the surface of FIG. 20, and the direction extending along the periphery of the bottom surface 10c of the recess 10a) at the tip of the second region R2, and a groove 15 formed along the longitudinal direction of the fifth region R5 at the tip of the fifth region R5.

The second region R2 and the fifth region R5 are each provided with the groove 15 of prescribed depth and shape formed along the longitudinal direction of the second region R2 and the fifth region R5 at the center in the width direction of the upper surface. In each groove 15, metal is buried, the metal resulting from the second region R2 and the fifth region R5 being crushed and squeezed out in the lateral direction when pressing is performed with a pressing force of a magnitude with which the second region R2 and the fifth region R5 crush.

In such a method of manufacturing the light emitting device, firstly, in the step of preparing the pair of lead electrodes 20 and 30, the groove 15 is formed at the tip of each of the second region R2 and the fifth region R5. Then, when the pair of lead electrodes 20 and 30 are pressed, depending on the pressing pressure, the second region R2 and the fifth region R5 crush, and part of the metal of the second region R2 and the fifth region R5 squeezes out in the lateral direction. Thus, the squeezed out metal is buried in the groove 15, whereby production of the metal portion 14 outside the second region R2 and the fifth region R5 is prevented. Accordingly, while the groove 15 in which metal is buried remains at each of the second region R2 and the fifth region R5 in the manufactured package, the second region R2 and the fifth region R5 will not have the metal portion 14.

Accordingly, in the light emitting device, when it is desired to keep the shape of the second region R2 and the fifth region R5, the groove 15 is preferably formed at the tip of each of the second region R2 and the fifth region R5.

The depth, shape, position to be formed and the like of the groove 15 are not limited, and should be adjusted as appropriate.

Variation 3

Figure 21:
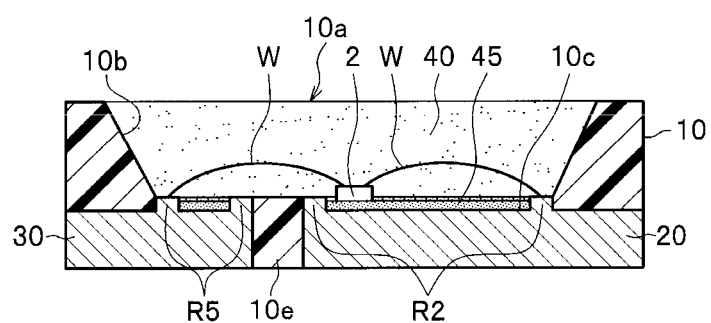
FIG. 21 is a schematic diagram of a cross-section of a light emitting device according to Variation 3 in which a die-bonding member is filled in a region for mounting a light emitting element.

FIG. 21 is a schematic diagram of a cross-section of a light emitting device according to Variation 3 in which a die-bonding member is filled in a region for mounting a light emitting element.

The light emitting device may be structured such that the sealing member 40 contains a first fluorescent material, and resin containing a second fluorescent material that is different from the first fluorescent material in the emission wavelength is packed in the region for mounting the light emitting element 2.

For example, as the first fluorescent material, a fluorescent material emitting green-color light is mixed with the sealing member 40. As the second fluorescent material, a fluorescent material emitting red-color light is mixed with the die-bonding member 45. Then, the die-bonding member 45 containing the second fluorescent material is packed in the region for mounting the light emitting element 2 (the metal exposed portion of the first lead electrode 20), and the light emitting element 2 is mounted. Thereafter, the sealing member 40 containing the first fluorescent material is packed in the recess 10a of the package 90, to obtain the light emitting device. Thus, the light emitting device being a bright white-color light source can be obtained. Note that, as shown in FIG. 21, the die-bonding member 45 containing the fluorescent material can also be packed in the metal exposed portion of the second lead electrode 30.

The type and combination of the first fluorescent material and the second fluorescent material should be selected as appropriate as desired.

Other Variations

Further, the lateral surface of the second region R2 and the fifth region R5 on the metal exposed surface side may be inclined outward from bottom to top in a cross-sectional view. Such a structure improves the light extracting efficiency.

The recess 10a of the package 90 may be formed into an elliptically cylindrical shape without being tilted. Further, the lateral surface 10b of the recess 10a may not necessarily be flat. It is also possible to mold the lateral surface 10b to have an uneven surface, such that the adhesion at the interface between the resin molded body 10 and the sealing member 40 improves. Further, though the recess 10a is molded to be elliptical in a plan view in the present embodiment, it may be molded to be circular in other embodiments. Still further, though the resin molded body 10 is molded to be rectangular in the present embodiment, the resin molded body 10 may be molded to have a circular, elliptical, or other polygonal shape in a plan view in other embodiments.

The lead electrodes should be provided, as in the present embodiment, by at least a pair of positive and negative electrodes (the first lead electrode 20 and the second lead electrode 30). However, it is also possible that three or more lead electrodes are provided.

The light emitting element 2 can be mounted on the second lead electrode 30 in place of the first lead electrode 20. When the light emitting device includes, for example, two light emitting elements 2, the light emitting elements 2 may be respectively mounted on the first lead electrode 20 and the second lead electrode 30. A protective element may be mounted on an inner lead portion where the light emitting element is not mounted. For example, by setting the width of the second region R2 and the fifth region R5 to 110 μm or more, a protective element can be mounted on the second region R2 of the first lead electrode 20 or on the fifth region R5 of the second lead electrode 30.

The light emitting element 2 may be an element having the opposite electrode structure (the double-surface electrode structure) in which, for example, the n-electrode (or the p-electrode) is formed on the back surface of the element substrate. Further, the light emitting element 2 is not limited to the face-up type, and may be the face-down type. With the light emitting element of the face-down type, the wires can be dispensed with.

In the method of manufacturing the light emitting device, when a lead frame in which a plurality of pairs of metal plates being the pairs of the first lead electrode 20 and the second lead electrode 30 are connected by suspension leads is used, the light emitting element 2 are previously mounted on the package 90 and thereafter singulated. However, the light emitting element 2 may be mounted on the singulated package 90.

The position where the wire W is connected may be the upper surface of each of the second region R2 and the fifth region R5. In suspending the wire W, the wire W can be more easily suspended when the height difference between the upper surface of the light emitting element 2 and the position where the wire W is suspended is smaller, that is, when the position where the wire W is suspended is high. Note that, since the width of the second region R2 and the fifth region R5 is 110 μm or more, the wire W is easily connected when the wire W is connected to the upper surface of the second region R2 and the fifth region R5.

The light emitting device of the present embodiments is applicable for a backlight light source of a liquid crystal display, various illumination devices, various display apparatuses such as a large-screen display, an advertisement, a destination guide and the like, and furthermore, an image reading apparatus in a digital video camera, a facsimile, a copier, a scanner and the like, a projector apparatus and the like.

As shown in the above descriptions, a package for mounting a light emitting element, a light emitting device, and methods of manufacturing the package and the light emitting device in accordance with the representative embodiments have been described herein, but the scope of the invention is not limited to the above description, and should be widely understood based on the scope of the claims. Further, based on the above description, it will be obvious that various changes and modifications can be made therein without departing from the scope of the embodiments of the invention.

What is claimed is:

1. A method of manufacturing a package for mounting a light emitting element, the method comprising:
providing a first lead electrode and a second lead electrode, the first lead electrode having, in a plan view, a first region configured for mounting a light emitting element, a second region surrounding an entire periphery of the first region and having a thickness greater than a thickness of the first region, and a third region surrounding at least a portion of a periphery of the second region and having a thickness smaller than a thickness of the second region, such that the second region projects from the top surfaces of the first and third regions;
forming a package comprising the first lead electrode, the second lead electrode, and a resin molded body, the package having a recess, and the first lead electrode and the second lead electrode respectively forming a portion of a surface defining a bottom of the recess, and the step of forming the package comprising:
using a mold having an upper mold part having a projection with a shape corresponding to the recess and a lower mold part on which the first lead electrode and the second lead electrode are to be placed,
placing the first lead electrode and the second lead electrode in predetermined positions on the lower mold part so that the first lead electrode and the second lead electrode are set between the upper mold part and the lower mold part, and the second region abuts the upper mold part and the lower mold part, and
pressing the upper mold part against the first lead electrode and the second lead electrode such that a bottom surface of the upper mold part abuts a top surface of the second region and a top surface of the lower mold abuts a bottom surface the second region;
injecting resin into the mold that is in contact with the first lead electrode and the second lead electrode;
curing the injected resin to harden the resin molded body such that, after the curing, a portion of the top surface of the second region of the first lead electrode is continuous with a portion of a lateral surface of the resin molded body defining a lateral side of the recess; and
removing the upper mold part from the lower mold part.

2. The method of manufacturing a package according to claim 1, wherein in pressing the first lead electrode and the second lead electrode with the upper mold part and the lower mold part, the first lead electrode and the second lead electrode are pressed by the mold by a pressing force with which contact between a surface of the projection of the upper mold part and an upper surface of the first region is avoided.

3. The method of manufacturing a package according to claim 1, wherein the first lead electrode and the second lead electrode pressed by the upper mold part and the lower mold part are integrally provided in a lead frame in which a plurality of pairs of lead electrodes are connected, each of the pairs comprising the first lead electrode and the second lead electrode, the method further comprising cutting off the package from the lead frame.

4. The method of manufacturing a package according to claim 1, wherein the second region has a groove.

5. The method of manufacturing a package according to claim 1, wherein a thickness difference between the thickness of the first region and the thickness of the second region being between 5 μm and 50 μm.

6. The method of manufacturing a package according to claim 1, wherein the second region of the first lead electrode has a width of 110 μm or more.

7. The method of manufacturing a package according to claim 6, wherein the width of the second region is 200 μm or less.

8. A method of manufacturing a package for mounting a light emitting element comprising:
providing a first lead electrode and a second lead electrode,
the first lead electrode having, in a plan view, a first region configured for mounting a light emitting element, a second region surrounding an entire periphery of the first region and having a thickness greater than a thickness of the first region, and a third region surrounding at least a portion of a periphery of the second region and having a thickness smaller than a thickness of the second region, such that the second region projects from the top surfaces of the first and third regions,
the second lead electrode having, in a plan view, a fourth region, a fifth region surrounding a periphery of the fourth region and having a thickness greater than a thickness of the fourth region, and a sixth region surrounding at least a portion of a periphery of the fifth region and having a thickness smaller than a thickness of the fifth region;
forming a package comprising the first lead electrode, the second lead electrode, and a resin molded body, the package having a recess, and the first lead electrode and the second lead electrode forming a portion of a surface defining a bottom of the recess, and the step of forming the package comprising:
using a mold having an upper mold part having a projection with a shape corresponding to the recess and a lower mold part on which the first lead electrode and the second lead electrode are to be placed,
placing the first lead electrode and the second lead electrode in predetermined positions on the lower mold part so that the first lead electrode and the second lead electrode are set between the upper mold part and the lower mold part, and the second region and the fifth region abut the upper mold part and the lower mold part, and
pressing the upper mold part against the first lead electrode and the second lead electrode such that a bottom surface of the upper mold part abuts a top surface of the second region and a top surface of the lower mold abuts a bottom surface the second region;
injecting a resin into the mold that is in contact with the first lead electrode and the second lead electrode;
curing the injected resin to harden the resin molded body such that, after the curing, a portion of the top surface of the second region of the first lead electrode is continuous with a portion of a lateral surface of the resin molded body defining a lateral side of the recess; and
removing the upper mold part from the lower mold part.

9. The method of manufacturing a package according to claim 8, wherein the second region has a groove.

10. The method of manufacturing a package according to claim 8, wherein a thickness difference between the thickness of the first region and the thickness of the second region being between 5 µm and 50 µm.

11. The method of manufacturing a package according to claim 8, wherein the second region of the first lead electrode has a width of 110 µm or more.

12. The method of manufacturing a package according to claim 11, wherein the width of the second region is 200 µm or less.

13. The method of manufacturing a package according to claim 8, wherein the fifth region of the second lead electrode has a width of 110 µm or more.

14. The method of manufacturing a package according to claim 13, wherein the width of the fifth region is 200 µm or less.

15. The method of manufacturing a package according to claim 8, wherein the fifth region projects from the top surfaces of the fourth and sixth regions.

16. A method of manufacturing a light emitting device, the method comprising:
providing a first lead electrode and a second lead electrode, the first lead electrode having, in a plan view, a first region configured for mounting a light emitting element, a second region surrounding an entire periphery of the first region and having a thickness greater than a thickness of the first region, and a third region surrounding at least a portion of a periphery of the second region and having a thickness smaller than a thickness of the second region, such that the second region projects from the top surfaces of the first and third regions;
forming a package comprising the first lead electrode, the second lead electrode, and a resin molded body, the package having a recess, and the first lead electrode and the second lead electrode respectively forming a portion of a surface defining a bottom of the recess, and the step of forming the package comprising:
using a mold having an upper mold part having a projection with a shape corresponding to the recess and a lower mold part on which the first lead electrode and the second lead electrode are to be placed,
placing the first lead electrode and the second lead electrode in predetermined positions on the lower mold part so that the first lead electrode and the second lead electrode are set between the upper mold part and the lower mold part, and the second region abuts the upper mold part and the lower mold part, and
pressing the upper mold part against the first lead electrode and the second lead electrode such that a bottom surface of the upper mold part abuts a top surface of the second region and a top surface of the lower mold abuts a bottom surface the second region;
injecting resin into the mold that is in contact with the first lead electrode and the second lead electrode;
curing the injected resin to harden the resin molded body such that, after the curing, a portion of the top surface of the second region of the first lead electrode is continuous with a portion of a lateral surface of the resin molded body defining a lateral side of the recess;
removing the upper mold part from the lower mold part; and
mounting a light emitting element on the first region.

17. The method of manufacturing a light emitting device according to claim 16, further comprising packing a sealing member in the recess so as to cover the light emitting element.

18. The method of manufacturing a light emitting device according to claim 16, wherein the second region has a groove.

19. The method of manufacturing a light emitting device according to claim 16, wherein a thickness difference between the thickness of the first region and the thickness of the second region being between 5 µm and 50 µm.

20. The method of manufacturing a light emitting device according to claim 16, wherein the second region of the first lead electrode has a width of 110 µm or more.

21. The method of manufacturing a light emitting device according to claim 20, wherein the width of the second region is 200 µm or less.

* * * * *